United States Patent [19]

Dünnebacke

[11] Patent Number: 5,708,390
[45] Date of Patent: Jan. 13, 1998

[54] SIGNAL AMPLIFIER ARRANGEABLE IN TWO DIFFERENT CONFIGURATION MODES

[75] Inventor: Joachim Dünnebacke, Herborn, Germany

[73] Assignee: U.S. Philips Corporation, New York, N.Y.

[21] Appl. No.: 670,375

[22] Filed: Jun. 25, 1996

[30] Foreign Application Priority Data

Jul. 12, 1995 [DE] Germany .................. 195 25 411.2

[51] Int. Cl.$^6$ ................ H03F 3/68; H03F 1/32
[52] U.S. Cl. ............ 330/51; 330/124 R; 330/146; 330/149; 381/120
[58] Field of Search ................ 330/51, 124 R, 330/146, 149, 295; 381/28, 120, 121

[56] References Cited

U.S. PATENT DOCUMENTS

| 4,494,077 | 1/1985 | Fukaya et al. ............... 330/295 |
| 5,101,170 | 3/1992 | Torazzina et al. ............ 330/146 X |

FOREIGN PATENT DOCUMENTS

0613242A1  8/1994  European Pat. Off. .

*Primary Examiner*—James B. Mullins
*Attorney, Agent, or Firm*—Steven R. Biren

[57] ABSTRACT

A signal amplifier includes four amplifier stages which can be arranged in two different configuration modes, a first configuration mode in which a series arrangement of two loads is arranged between output terminals of a first and a third one of the amplifier stages, a reference potential being applied to a node between the loads, a first signal to be amplified being applied to an input of the first amplifier stage, and a second signal to be amplified being applied to an input of the third amplifier stage, and a second configuration mode in which a first one of the loads is arranged between the output terminal of the first amplifier stage and an output terminal of a second amplifier stage, and a second one of the loads is arranged between the output terminal of the third amplifier stage and an output terminal of a fourth amplifier stage, and the first signal to be amplified being applied to an input of the first amplifier stage and an input of the second amplifier stage and the second signal to be amplified being applied to the input of the third amplifier stage and an input of the fourth amplifier stage. The signal amplifier also includes a switching device for switching the signal amplifier selectively to one of the two configuration modes. A particularly low-loss and low-distortion operation of such a signal amplifier is achieved by a detection device for detecting the distortion factor of the signal at the output terminal of the first and/or the third amplifier stage and for actuating the switching device in dependence on the detected value of the distortion factor.

8 Claims, 2 Drawing Sheets

5,708,390

SIGNAL AMPLIFIER ARRANGEABLE IN TWO DIFFERENT CONFIGURATION MODES

BACKGROUND OF THE INVENTION

1. Field of the Invention

The invention relates to a signal amplifier comprising four amplifier stages which being arranged in two different configuration modes, a first configuration mode in which a series arrangement of two loads is arranged between output terminals of a first and a third one of the amplifier stages, a reference potential being applied to a node between the loads, a first signal to be amplified being applied to an input of the first amplifier stage, and a second signal to be amplified being applied to an input of the third amplifier stage, and a second configuration mode in which a first one of the loads is arranged between the output terminal of the first amplifier stage and an output terminal of a second amplifier stage, and a second one of the loads is arranged between the output terminal of the third amplifier stage and an output terminal of a fourth amplifier stage, and the first signal to be amplified being applied to an input of the first amplifier stage and to an input of the second amplifier stage, and the second signal to be amplified being applied to the input of the third amplifier stage and to an input of the fourth amplifier stage, the signal amplifier further comprising a switching device for switching the signal amplifier selectively to one of the two configuration modes.

2. Description of the Related Art

Such a signal amplifier is known from EP 0 613 242 A1, corresponding to U.S. Pat. Nos. 5,365,188 and 5,444,417. The self-configurable power amplifier described therein comprises a window comparator for detecting the level of the input signals fed to the amplifier. A plurality of configuring switches enable the amplifier to be configured as a single bridge amplifier or as two distinct bridge amplifiers. As long as the levels of the input signals remain within a range defined by a negative and a positive voltage reference, the amplifier is configured as a single-bridge amplifier. However, if the instantaneous values of the input signals exceed said voltage references, the window comparator changes state and switches the amplifier to the configuration with two distinct bridge amplifiers. This reduces the power dissipation of the amplifier for input signals whose instantaneous values are within the "window" of the comparator to about a quarter of the power dissipation of the two distinct bridge amplifiers. This results in a net decrease of the power dissipation of the amplifier.

In the known arrangement the change-over criterion for the amplifier configuration is obtained by comparing the level of the input signals and, when appropriate, also that of the output signals with a voltage reference. It has been found that in the case of fluctuating operating voltages, as occur particularly in automotive use, this may give rise to problems. Moreover, the feedback loops used in the known circuit arrangement tend to exhibit parasitic oscillations.

SUMMARY OF THE INVENTION

It is an object of the invention to construct a circuit arrangement of the type defined in the opening paragraph so as to preclude the above problems. Particularly, the effects of fluctuating operating voltages on the configuration of the signal amplifier and consequently on the reproduction quality of the signals supplied by this amplifier should be avoided.

In a signal amplifier of the type defined in the opening paragraph this is achieved, according to the invention, by means of a detection device for detecting the distortion factor of the signal at the output terminal of the first and/or the third amplifier stage and for actuating the switching device in dependence on the detected value of the distortion factor.

Thus, the signal amplifier in accordance with the invention no longer uses fixed predetermined voltage references as switching thresholds for the "window comparator"; instead, the reproduction quality of the signal at the output terminal is determined directly on the basis of the distortion factor. As long as the distortion factor, and hence the distortion of the signal, at the output terminal are small enough, i.e., as long as the reproduction quality is satisfactory, the signal amplifier is in the first configuration mode, in which it has a low power dissipation. Changing over to the second configuration mode, which is suitable for higher amplitudes but has a higher power dissipation, is not effected until the distortion factor increases and the reproduction quality consequently decreases. Thus, reproduction quality is maintained at a high level even in the case of fluctuating operating voltages, without the power dissipation increasing unnecessarily. As a matter of fact, if, in the case of a fluctuating operating voltage, a higher distortion factor occurs at different levels or amplitudes of the signal to be amplified, the change-over between the two configuration modes is adapted, in accordance with the invention, to the starting point where the distortion factor tends to exceed the permissible value. Conversely, in the case of a comparison of the level of the input signal with a fixed reference potential, a further safety margin would have to be observed and the "window" would have to be so narrow that the distortion factor also remains limited in the case of an unfavorable operating voltage. The invention enables the range for the input signal, i.e., the signal to be amplified, to be utilized completely in any case, i.e., for all values of the operating voltage and to sustain the low-loss first configuration mode as long as possible. Preferably, the circuit arrangement in accordance with the invention is constructed in such a manner that switching to the first configuration mode by the switching device is possible if the detected value of the distortion factor becomes smaller than a given limit value and, in the other case, switching to the second configuration mode is possible.

Preferably, the detection device is capable of determining an instantaneous value of the distortion factor. To this end, it is in principle possible to compare the instantaneous value of one or more harmonics of the signal to be amplified in the signal at the output of the signal amplifier with the instantaneous value of the fundamental of the signal to be amplified in its amplified form as a signal at the output of the signal amplifier, an increase of the instantaneous value of the harmonics being equivalent to an increase of the distortion factor and immediately causing the change-over to the second configuration mode. However, alternatively, changing over may be effected in such a manner that the detection device determines the distortion factor in dependence upon the signal amplitude and, when a limit value of the signal amplitude is exceeded, defines a switching level above which a change-over from the first to the second configuration mode takes place when this level is exceeded by the instantaneous value of the signal. Again, changing over is not effected at fixed predetermined voltage value limits; instead, switching levels are determined through the detection of the distortion factor, above which levels the output signal assumes an impermissibly high distortion factor or the input signal, i.e., the signal to be amplified, generates an output signal with an impermissibly high non-linear distortion. If the operating voltage now varies, the switching level will automatically be adapted, accordingly. At option, the switching level may be such that the signal to be amplified or the signal at the output of the signal amplifier being compared with the switching level.

In another embodiment of the invention the detection device detects a transition of the first and/or the third amplifier stage into a saturation state. Before the saturation state is reached, the first configuration mode is operative, and when the saturation state is reached, the second configuration mode is activated. Detection of the saturation state provides a simple possibility to determine an increase of the non-linear distortion, because this is mainly caused by non-linearities arising when the saturation state is reached.

In a further embodiment of the invention, in order to obtain exactly corresponding gain factors in both configuration modes and thereby ensure a low-distortion signal amplification, a gain control device in each one of the first and second amplifier stages, this gain control device being actuated concurrently with the switching device, sets the gain factors of these amplifier stages to a first value in the first configuration mode and to a smaller second value in the second configuration mode. Thus, allowance is made for the fact that the second and the fourth amplifier stage also contribute to the signal amplification in the second configuration mode.

In the first configuration mode the reference potential is preferably be applied to the node between the loads via the second and/or the fourth amplifier stage. In principle, the outputs of both the second and the fourth amplifier stage may then be at reference potential. However, in practice, manufacturing tolerances may give rise to small potential differences at the outputs of these amplifier stages. These differences may give rise to undesired compensation currents, causing additional losses. In order to preclude the compensation currents, it is therefore preferred that in the first configuration mode, either the second or the fourth amplifier stage is switched to operation with a high-impedance output terminal.

BRIEF DESCRIPTION OF THE DRAWINGS

An embodiment of the invention is shown, by way of example, in the drawings and will be described in more detail hereinafter. In the drawings.

DESCRIPTION OF THE PREFERRED EMBODIMENT

Figure 1:
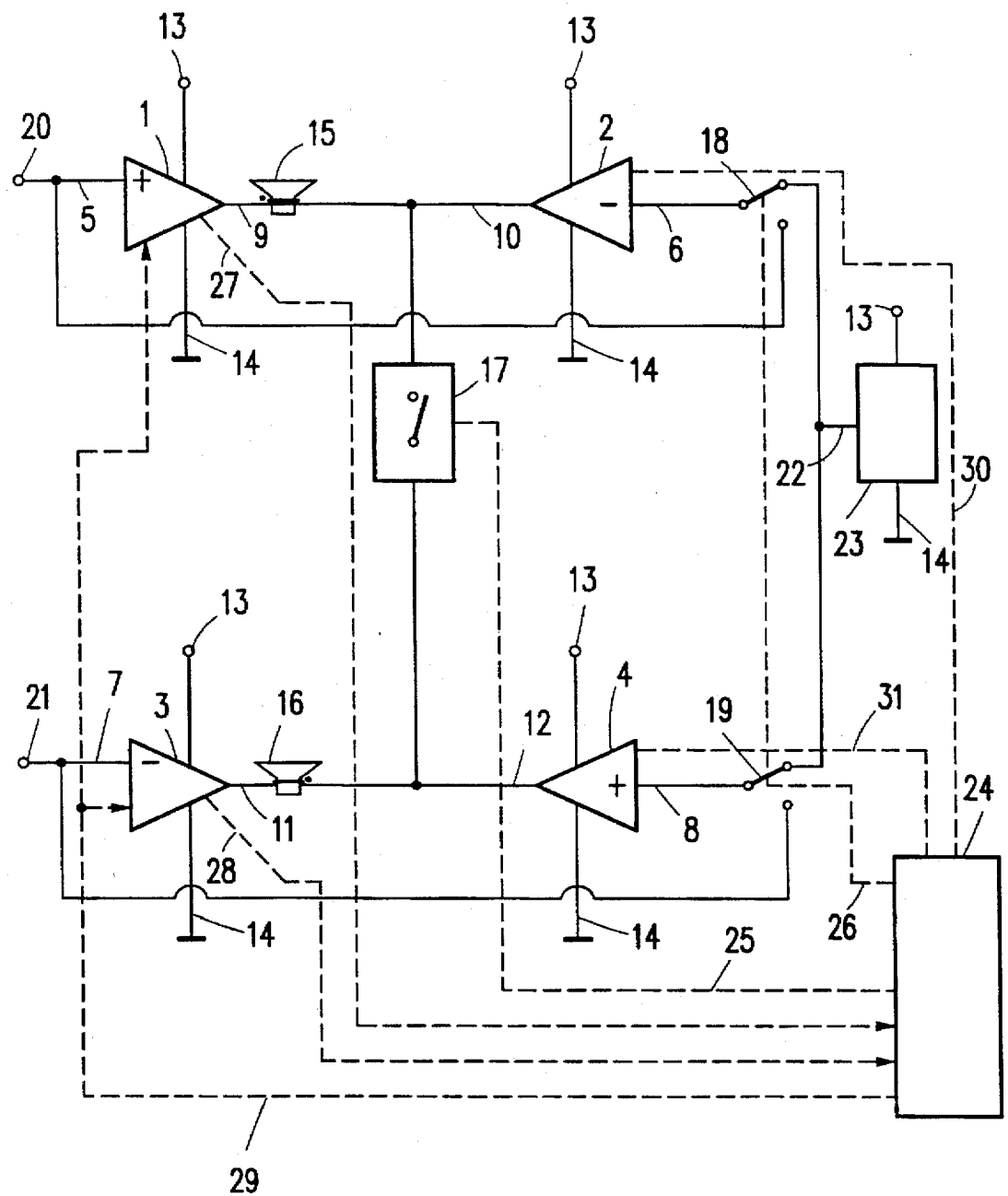
FIG. 1 shows an embodiment of the invention in a block-schematic diagram.

FIG. 1 shows a first, a second, a third and a fourth amplifier stage bearing the reference numerals 1 to 4, respectively, which form parts of a signal amplifier in accordance with the invention. Each of the amplifier stages 1 to 4 has an input 5, 6, 7 and 8, respectively, an output terminal 9, 10, 11 and 12, respectively, an operating voltage terminal 13, which, in the present example, is a common terminal, and a ground terminal 14. A first load 15 is arranged between the output terminals 9 and 10 of the first and second amplifier stages 1 and 2, respectively, and a second load 16 is arranged between the output terminals 11 and 12 of the third and the fourth amplifier stages 3 and 4, respectively. In FIG. 1, both loads 15, 16 are formed by loudspeakers. Moreover, the output terminal 10 of the second amplifier stage 2 and the output terminal 12 of the fourth amplifier stage 4 are connected to one another via a first switch 17. In the conductive state, the first switch 17 forms a connection via which the loads 15, 16 are arranged in series. In its cut-off state the first switch 17 separates the arrangement comprising the amplifier stages 1, 2 and the first load 15, and the arrangement comprising the third and the fourth amplifier stage 3, 4 and the second load 16, from one another.

A first signal input 20, which can receive a first signal to be amplified from an external signal source, not shown, is connected directly to the input 5 of the first amplifier stage 1 and, via a second switch 18, to the input 6 of the second amplifier stage 2. Likewise, a second signal input 21 for a second signal to be amplified is connected directly to the input 7 of the third amplifier stage 3 and, via a third switch 19, to the input 8 of the fourth amplifier stage 4. The second and the third switch 18 and 19 are change-over switches by means of which the inputs 6 and 8 of the second 2 and the fourth 4 amplifier stage being coupled selectively to a common output 22 of a reference potential source 23, which preferably supplies a voltage corresponding to half the value of the operating voltage.

The first, second and third switches 17, 18, 19 together form a switching device for selectively switching the signal amplifier shown in FIG. 1 to a first configuration mode and to a second configuration mode. In the first configuration mode, which corresponds to an arrangement of two series-connected push-pull amplifiers, the first switch 17 is conductive and second and third switch 18, 19 are in the switch positions shown in FIG. 1, in which the input 6 of the second amplifier stage 2 and the input 8 of the fourth amplifier stage 4 are jointly connected to the output 22 of the reference potential source 23. The reference potential is applied to the input 6 of the second amplifier stage 2, which is an inverting input, and to the input 8 of the fourth amplifier stage 4, which is a non-inverting input, this reference potential also appearing on the output terminals 10 and 12 of the second and fourth amplifiers stages 2 and 4, respectively. As a result, the first amplifier stage 1 with the first load 15 operates at this reference potential independently of the third amplifier stage 3 with the second load 16. The loads 15, 16 are then arranged in series. The input 5 of the first amplifier stage 1 in FIG. 1 is the non-inverting input and the input 7 of the third amplifier stage 3 is the inverting input. In an example in which the signal amplifier in accordance with the invention drives two loudspeakers of a stereo channel which are mounted in the front part and the rear part of the passenger compartment of a motor vehicle, the first and second signals to be amplified at the signal inputs 20, 21 correspond. The amplified signals at the output terminals 9 and 11 of the first and the third amplifier stage 1 and 3, respectively, are then in phase opposition, so that the second and the fourth amplifier stage 2,4 carry no signal current in the case of corresponding amplification and identical loads (loudspeakers). As a result, the power dissipation caused by the second and the fourth amplifier stage 2, 4 is very low.

In the second configuration mode the first switch 17 is cut off and the second and third switches 18, 19 are set to their switch positions, not shown. The second switch 18 then connects the input 6 of second amplifier stages 2 to the first signal input 20 and the third switch 19 connects the input 8 of the fourth amplifier stage 4 to the second signal input 21. The first and the second amplifier stage 1, 2 now form a bridge amplifier and drive the first load 15 in phase opposition with the signals at their output terminals 9, 10. Likewise, the third and fourth amplifier stages 3, 4 form a second bridge amplifier for the second load 16. In the example described above, the loads 15, 16 are then driven independently of one another with the same signal in the correct phase relationship, i.e., changing over between the configuration modes is possible in operation without the occurrence of a signal transient or other disturbance in the signal.

To actuate the switching device 17, 18, 19, the signal amplifier shown in FIG. 1 comprises a control circuit 24, which is connected to the first switch 17 via a first control line 25 and to the switches 18, 19 via a second control line 26. The first amplifier stage 1 and the third amplifier stage 3 each include a detection device for detecting the distortion factor of the signal at their respective output terminals 9 and 11. This detection device comprises, for example, a measurement circuit for measuring the instantaneous value or the amplitude of harmonics of the signal to be amplified or the signal at the respective output terminals 9 and 12. Optionally, non-linear signal distortions may be detected or the transition to a saturation state of the first and the third amplifier stage 1, 3 is detected. A detection signal thus obtained appears at an associated detection signal output 27 or 28 of the first and second amplifier stages 1 and 3, respectively, and is applied to the control circuit 24, to which the detection signal outputs 27, 28 are connected. If the control circuit 24 detects a high distortion factor or a transition to saturation in one of the amplifier stages 1,3, the circuit arrangement is switched from the first configuration mode to the second configuration mode via the control lines 25, 26.

The first and third amplifier stages 1, 3 are further connected to the control circuit 24 via a third control line 29. By means of this third control line 29, a control signal is applied to the first and the third amplifier stage 1, 3 concurrently with the actuation of the switching device 17, 18 and 19, by means of which control signal, gain control devices in the amplifier stages 1, 3 being actuated. As a result of this, the gain factors of the first and the third amplifier stage 1, 3 are set from a first value in the first configuration mode, to a smaller second value in the second configuration mode. In the second configuration mode the gain factor of each of the amplifier stages 1, 3 is reduced by, for example, 6 dB relative to that in the first configuration mode. The actuation of the second and fourth amplifier stages 2,4 in the second configuration mode then proceeds without any change in the slope of the amplifier characteristic.

The detection device and the control circuit 24 may also be constructed in such a manner that they determine the time-averaged distortion factor from an amplitude ratio between the fundamental wave and harmonics of the signals at the output terminal 9 and 11, i.e., particularly between harmonics not present in the signal to be amplified at the signal inputs 20, 21. This determination of the distortion factor is effected in dependence on the signal amplitude or the amplitude of the fundamental wave. From the value of the signal amplitude at which the distortion factor exceeds a given limit value, a switching level is derived. The instantaneous value of the signal at the signal input 20, 21 or, optionally, at the output terminal 9, 11 is compared with this switching level. If the instantaneous value exceeds the switching level, the control circuit 24 will change over from the first to the second configuration mode. Since the switching level always tracks the distortion factor, the present arrangement also compensates for the effects of, for example, a fluctuating operating voltage in spite of the time-averaging.

FIG. 1 further shows a fourth and a fifth control line 30 and 31, respectively, which are optional. By means of these control lines 30, 31, either the second or the fourth amplifier stage 2 or 4 being switched to operation with a high-impedance output terminal in the first configuration mode. A practical embodiment will therefore comprise only one of the two control lines 30, 31.

Figure 2:
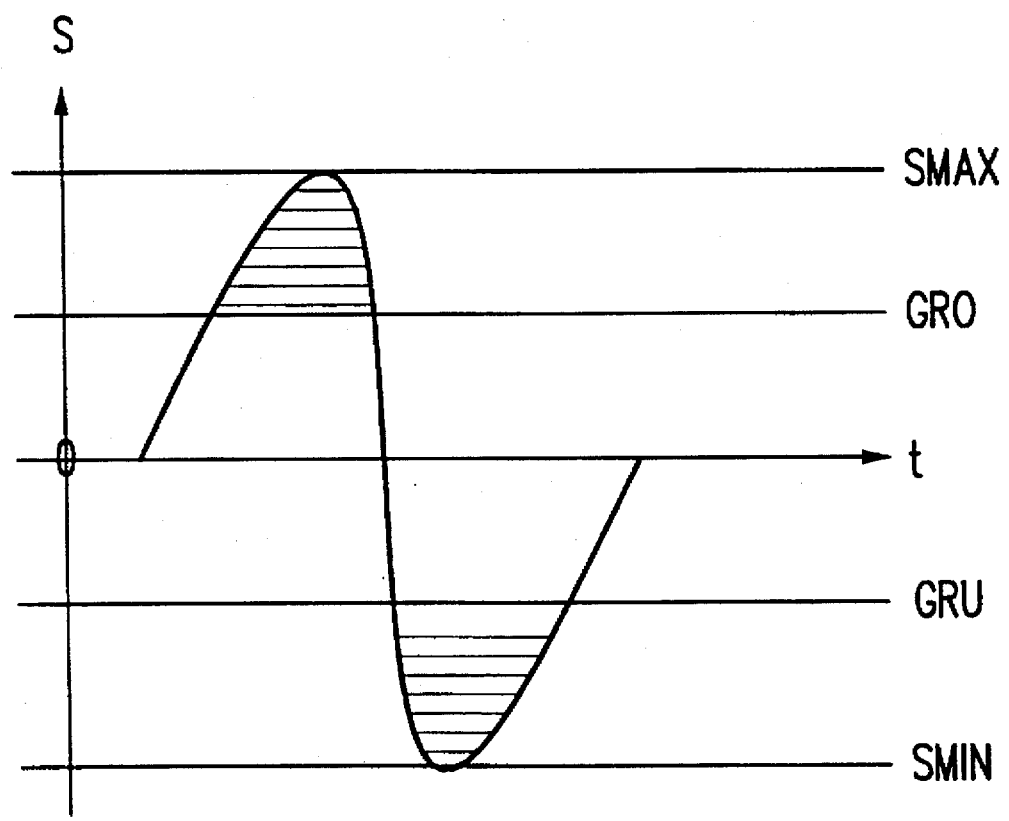
FIG. 2 is a waveform diagram for explaining the operation of the circuit arrangement shown in FIG. 1.

FIG. 2 shows diagrammatically the operation of the two configuration modes in dependence on the instantaneous value of the signal at the output terminals 9, 11 of the first and third amplifier stages 1 and 3, respectively. The signal S varies as a function of time t relative to a reference potential 0 between a minimum value SMIN and a maximum value SMAX. In a range around the reference potential 0 between a lower switching level GRU and an upper switching level GRO, the signal amplifier is in the first configuration mode, and outside the "window" defined by the switching levels GRU and GRO, the signal amplifier operates in the second configuration mode. In the example shown in FIG. 2, a switching level is crossed four times in one period of the signal S. The configuration mode is changed over upon each crossing. For the sake of clarity, the regions in which the second configuration mode is active are shown as horizontally hatched areas.

An advantageous field of use of the signal amplifier in accordance with the invention is automotive audio technology, particularly in loudspeaker amplifiers. Such devices require very low power dissipations in spite of high signal powers at the loudspeakers. Moreover, these high signal powers should be available with a very low distortion. The signal amplifier in accordance with the invention is then based on the recognition of the fact that an average audio signal only seldom requires the use of the second configuration mode. The invention then guarantees a low-loss and low-distortion operation, particularly enabling the use of a circuit arrangement without output coupling capacitors. As a result, a cheaper and more compact construction is possible and it is possible, particularly, to incorporate the signal amplifier in an integrated device. Suitably, the distortion factor is detected either by determining the saturation state, preferably a saturation voltage of the amplifying devices at the output side of the amplifier stages, or by comparing the signal voltages at the signal inputs with a corresponding portion of the signals at the output terminals of the amplifier stages.

I claim:

1. A signal amplifier comprising four amplifier stages which are arrangeable in two different configuration modes, a first configuration mode in which a series arrangement of two loads is arranged between output terminals of a first and a third one of the amplifier stages, a reference potential being applied to a node between the loads, a first signal to be amplified being applied to an input of the first amplifier stage and a second signal to be amplified being applied to an input of the third amplifier stage, and a second configuration mode in which a first one of the loads is arranged between the output terminal of the first amplifier stage and an output terminal of a second amplifier stage, and a second one of the loads is arranged between the output terminal of the third amplifier stage and an output terminal of a fourth amplifier stage, and the first signal to be amplified being applied to an input of the first amplifier stage and an input of the second amplifier stage, and the second signal to be amplified being applied to the input of the third amplifier stage and an input of the fourth amplifier stage, said signal amplifier further comprising a switching device for switching the signal amplifier selectively to one of the two configuration modes, wherein said signal amplifier further comprises a detection device for detecting a distortion factor of a signal at the output terminal of the first and/or the third amplifier stage and for actuating the switching device in dependence on a detected value of the distortion factor.

2. A signal amplifier as claimed in claim 1, wherein the switching device switches the signal amplifier to the first configuration mode the detected value of the distortion factor as detected by the detection device becomes smaller than a given limit value, and said switching device switches the signal amplifier to the second configuration mode in all other cases.

3. A signal amplifier as claimed in claim 1, wherein the detection device determines an instantaneous value of the distortion factor.

4. A signal amplifier as claimed in claim 1, wherein the detection device detects a transition to a saturation state of the first and/or the third amplifier stage, said detection device causing said switching device to switch the signal amplifier to the first configuration mode before the saturation state is reached and to switch the signal amplifier to the second configuration mode in the saturation state.

5. A signal amplifier as claimed in claim 1, wherein the detection device determines the distortion factor in dependence on the signal amplitude and derives a switching level from the signal amplitude when a limit value is exceeded, switching from the first to the second configuration mode being effected by the switching device when the instantaneous value of the signal exceeds said switching level.

6. A signal amplifier as claimed in claim 1, wherein each of the first and second amplifier stages comprises a gain control device, each of said gain control devices being actuated concurrently with the switching device to set the gain factors of the first and second amplifier stages to a first value in the first configuration mode and to a second value smaller than the first value in the second configuration mode.

7. A signal amplifier as claimed in claim 1, wherein, in the first configuration model the reference potential is applied to the node between the loads via the second and/or the fourth amplifier stage.

8. A signal amplifier as claimed in claim 7, wherein, in the first configuration mode, either the second or the fourth amplifier stage is switched to operation with a high-impedance output terminal.

* * * * *